US009853419B2

(12) United States Patent
Uchida

(10) Patent No.: US 9,853,419 B2
(45) Date of Patent: Dec. 26, 2017

(54) OPTICAL AMPLIFYING ELEMENT, LIGHT SOURCE DEVICE, AND IMAGE PICKUP DEVICE

(71) Applicant: CANON KABUSHIKI KAISHA, Tokyo (JP)

(72) Inventor: Takeshi Uchida, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/345,268

(22) Filed: Nov. 7, 2016

(65) Prior Publication Data

US 2017/0141538 A1 May 18, 2017

(30) Foreign Application Priority Data

Nov. 12, 2015 (JP) ................................ 2015-222513

(51) Int. Cl.

| | |
|---|---|
| ***H01S 5/068*** | (2006.01) |
| ***H01S 5/042*** | (2006.01) |
| ***G01B 9/02*** | (2006.01) |
| ***H01S 5/0683*** | (2006.01) |
| ***H01S 5/0687*** | (2006.01) |

(52) U.S. Cl.

CPC ...... *H01S 5/06837* (2013.01); *G01B 9/02007* (2013.01); *G01B 9/02091* (2013.01); *H01S 5/042* (2013.01); *H01S 5/0687* (2013.01)

(58) Field of Classification Search

CPC .... H01S 5/0687; H01S 5/06837; H01S 3/105; H01S 3/1053; H01S 3/139

See application file for complete search history.

(56) References Cited

U.S. PATENT DOCUMENTS 6,201,638 B1 * 3/2001 Hall ........................ G02F 1/395 359/346
8,059,690 B2 11/2011 Chang-Hasnain et al.
8,189,643 B2 5/2012 Chang-Hasnain et al.
2006/0268398 A1 * 11/2006 Cole ...................... H01S 5/041 359/344
2012/0002271 A1 * 1/2012 Kuramoto ............ H01S 5/1064 359/344
2015/0153563 A1 * 6/2015 Kamal ................ G02B 26/001 372/20
2016/0028207 A1 * 1/2016 Cable ................ G01B 9/02091 372/20

OTHER PUBLICATIONS

Jayaraman, V., et al., "OCT Imaging up to 760 kHz Axial Scan Rate Using Single-Mode 1310nm MEMS-Tunable VCSELs with >100nm Tuning Range", Lasers and Electro-Optics (CLEO) Conference, 2011, 1-2.

* cited by examiner

*Primary Examiner* — Eric Bolda
(74) *Attorney, Agent, or Firm* — Canon USA Inc., IP Division

(57) ABSTRACT

An optical amplifying element includes: a pair of reflectors that constitutes a cavity; an active layer disposed between the pair of reflectors; and an excitation unit configured to excite the active layer, wherein the active layer excited by the excitation unit amplifies intensity of a laser beam that enters the optical amplifying element when the laser beam reflects back and forth within the cavity, and wherein the pair of reflectors is configured to change a length of the cavity according to a wavelength of the laser beam.

18 Claims, 10 Drawing Sheets

100 Z Y X 111 106 107 112 105 104 108 114 109 113 103 102 101 110 115

600
605
603
602
601
610
310
314
313
250
255
311
312

OPTICAL AMPLIFYING ELEMENT, LIGHT SOURCE DEVICE, AND IMAGE PICKUP DEVICE

BACKGROUND OF THE INVENTION

Field of the Invention

The present invention generally relates to optical amplifiers, and in particular it relates to an optical amplifying element, as well as light source devices and image pickup devices equipped with such optical amplifying element.

Description of Related Art

Wavelength tunable lasers capable of changing oscillation wavelengths are applied to Optical Coherence Tomography (OCT) apparatuses, and active research and development in this type of lasers has been conducted to improve efficiency and other parameters related thereto. Known wavelength tunable lasers include a laser that controls the oscillation wavelength of a vertical-cavity surface-emitting laser (generally referred to as VCSEL) by a Micro Electro Mechanical Systems (MEMS) technique, so-called MEMS-VCSEL. Specifically, the MEMS-VCSEL varies a cavity length by mechanically moving one of a pair of reflectors to change the laser oscillation wavelength.

Since output of the MEMS-VCSEL is small, in order to use the MEMS-VCSEL for a light source device, the light source device is configured such that an optical amplifying element amplifies the light output of the MEMS-VCSEL. In an article entitled "OCT Imaging up to 760 kHz Axial Scan Rate Using Single-Mode 1310 nm MEMS-Tunable VCSELs with >100 nm Tuning Range", by V. Jayaraman, et al., disclosed in the Lasers and Electro-Optics (CLEO) Conference, 1-2 (2011), OCT image pickup is performed by using a light source device that uses the MEMS-VCSEL and a Semiconductor Optical Amplifier (hereinafter referred to as SOA). The SOA amplifies light emitted from the MEMS-VCSEL.

When intensity of a laser beam is amplified using SOA described in V. Jayaraman, et al, "OCT Imaging up to 760 kHz Axial Scan Rate Using Single-Mode 1310 nm MEMS-Tunable VCSELs with >100 nm Tuning Range", Lasers and Electro-Optics (CLEO) Conference, 1-2 (2011), light called amplified spontaneous emission (hereinafter referred to as ASE) is also output, in addition to the amplified laser beam. The ASE is light obtained by amplifying light generated by spontaneous emission within the SOA by stimulated amplification. Accordingly, the ASE has no coherency with the laser beam amplified by the SOA.

Conventionally, in order to increase a signal-to-noise ratio (SN ratio), intensity of the laser beam is preferably increased; however, in an opthalmological OCT apparatus for acquiring a tomogram of a fundus of an eye, the intensity of the laser beam to be projected on a subject's eye is limited due to safety concerns. Since the ASE is contained in the light to project on a measurement object together with the laser beam, in order to limit optical output, it is necessary to limit the intensity of the beam including intensity of the ASE to equal to or less than a limiting value. Meanwhile, since the OCT uses interference of the laser beam, the ASE that does not interfere with the laser beam cannot be a signal for obtaining the tomogram by OCT. That is, if the ASE exists in an OCT apparatus, it is necessary to lower the intensity of the laser beam that generates an interfering signal compared with a case where the ASE does not exist, resulting in lower SN ratio.

SUMMARY OF THE INVENTION

An object of the present invention is to provide an optical amplifying element that reduces the ASE in the laser beam while increasing the SN ratio.

An optical amplifying element according to the embodiments disclosed herein includes: a pair of reflectors that constitutes a cavity; an active layer disposed between the pair of reflectors; and an excitation unit configured to excite the active layer, wherein the active layer excited by the excitation unit amplifies the intensity of a laser beam that enters the optical amplifying element when the laser beam reflects back and forth within the cavity, and wherein the pair of reflectors is configured to change a length of the cavity according to a wavelength of the laser beam.

Further features of the present invention will become apparent from the following description of exemplary embodiments with reference to the attached drawings.

DESCRIPTION OF THE EMBODIMENTS

Figure 1A:
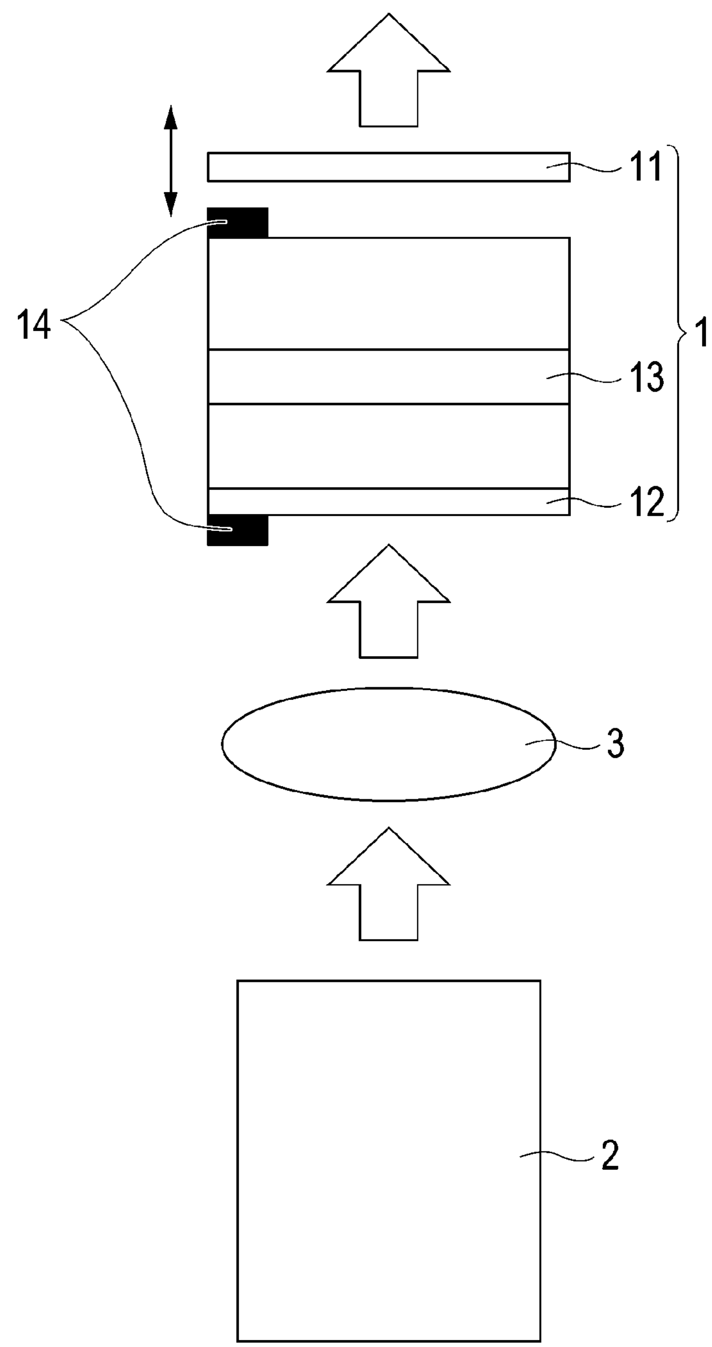
FIGS. 1A and 1B are schematic views illustrating one example of a light source device including an optical amplifying element according to an embodiment of the present invention.

FIG. 1A is a schematic view illustrating one example of a light source device according to an embodiment of the present invention. The light source device includes an optical amplifying element 1, a wavelength tunable laser 2, and an optical element 3 for causing light emitted from the wavelength tunable laser 2 to enter the optical amplifying element 1.

Figure 1B:
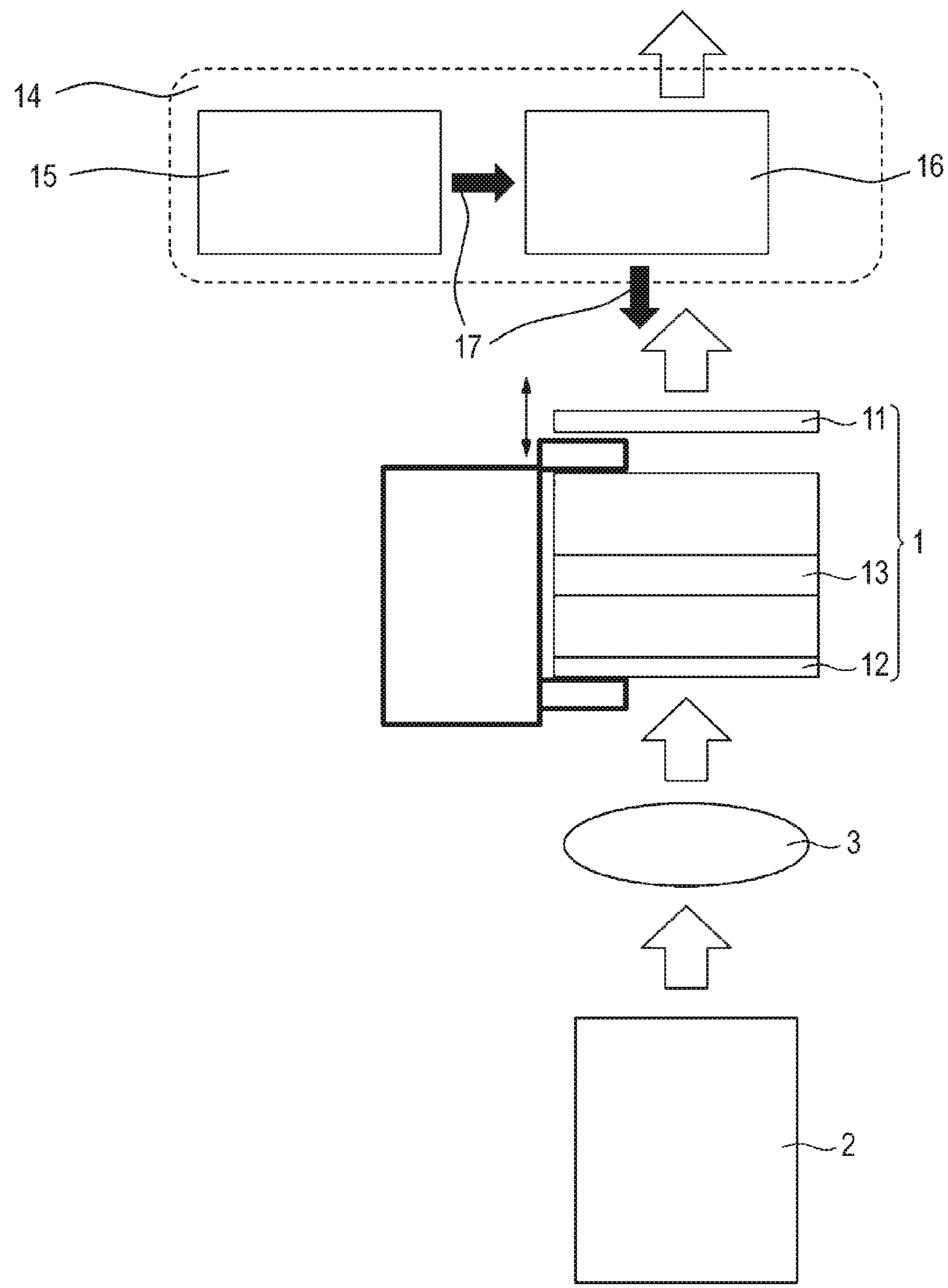

The optical amplifying element 1 includes a pair of reflectors 11, 12 that constitutes a cavity, an active layer 13 disposed between the pair of reflectors 11, 12, and an excitation unit 14 for exciting the active layer 13. The excitation unit 14 may be, for example, a pair of electrodes that injects an electric current into the active layer 13, as illustrated in FIG. 1A. The excitation unit 14 is not particularly limited as long as the excitation unit 14 forms population inversion in the active layer 13, and may be an external light source that performs photoexcitation in the active layer 13, as illustrated in FIG. 1B. In FIG. 1B, the excitation unit 14 includes a pump laser 15 and a circulator 16. The pump laser 15 generates pump light 17, which causes population inversion in the active layer 13. The pump light 17 goes through the circulator 16 and is irradiated into the active layer 13. The light output from the optical amplifying element 1 goes through the circulator 16 and is output at a different port from that of the pump light 17 input.

The light emitted from the wavelength tunable laser 2 passes through the optical element 3 and then enters the optical amplifying element 1. The light that enters the optical amplifying element 1 is then amplified in intensity by the active layer 13 excited by the excitation unit 14 and the cavity of the optical amplifying element 1, and then the light is emitted from the optical amplifying element 1. Specifically, the light emitted from the wavelength tunable laser 2 enters the optical amplifying element 1, undergoes multiple reflection by the cavity, and passes through the active layer 13 excited by the excitation unit 14 multiple times. Population inversion is formed in the excited active layer 13. While the light emitted from the wavelength tunable laser 2 passes through the active layer 13 multiple times, stimulated emission occurs many times, and intensity of light identical to the light emitted from the wavelength tunable laser 2 in wavelength is amplified.

For this reason, the optical amplifying element 1 of the present invention has a structure to change a cavity length according to the wavelength of the light emitted from the wavelength tunable laser 2. Specifically, a position of the reflector 11 is changed in terms of time in a direction in which the pair of reflectors 11, 12 and the active layer 13 are laminated so that the light with an oscillation wavelength emitted from the wavelength tunable laser 2 resonates in the optical amplifying element 1. This structure allows the optical amplifying element 1 to amplify the light with the oscillation wavelength according to sweeping of the oscillation wavelength of the wavelength tunable laser 2. Moreover, this structure inhibits spontaneous emission at wavelengths at which the light intensity is not amplified by resonance, and thus energy for exciting the active layer 13 will be efficiently used for amplification of the light with the wavelength emitted from the wavelength tunable laser 2.

Furthermore, even if the spontaneous emission light is generated within the optical amplifying element 1, this light has a wavelength hardly responding to the cavity length, and is hardly amplified by the cavity of the optical amplifying element 1. Thus, generation of the ASE is inhibited. As a result, the optical amplifying element 1 emits a coherent laser beam that has a wavelength almost identical to the wavelength of the light emitted from the wavelength tunable laser 2, but with increased intensity and reduced noise. Since the ASE is inhibited as described above in a whole range of a wavelength tunable width of the wavelength tunable laser 2, the optical amplifying element 1 emits the coherent light that contains almost no ASE light at each time of the wavelength sweeping. Also, the disclosed optical amplifying element can reduce more significantly than conventional devices a proportion of the ASE in total quantity of light in the wavelength sweep range emitted from the light source device.

In addition, the optical amplifying element 1 can maintain a spectral line width equivalent to a line width of the MEMS-VCSEL. This maintains a coherent length of the light source device, and provides a deeper tomogram with a wide angle of view in the OCT.

Although the excitation unit 14 excites the active layer 13, the optical amplifying element 1 is configured not to oscillate like a laser. Accordingly, the reflectivity of the reflectors 11, 12 is set so as to prevent the optical amplifying element 1 from oscillating like a laser. Therefore, the reflectivity of the reflectors 11, 12 is preferably 99.0% or less in the wavelength tunable width of the wavelength tunable laser 2, and is more preferably 95.0% or less. Also, the reflectors 11, 12 need to have the reflectivity such that the cavity of the optical amplifying element 1 causes the light with the oscillation wavelength of the wavelength tunable laser 2 to reciprocate multiple times and to resonate. Therefore, the reflectivity of the reflectors 11, 12 is preferably 60.0% or more in the wavelength tunable width of the wavelength tunable laser 2, and is more preferably 80.0% or more. For example, when a multilayer film like a distributed Bragg reflector constitutes a reflective layer, the reflectivity can be controlled by changing a number of layers of the multilayer film.

In addition, in order to cause the cavity length of the optical amplifying element 1 to correspond to the wavelength of the light emitted from the wavelength tunable laser 2, it is necessary to synchronize the reflector 11 of the optical amplifying element 1 with a wavelength tunable mechanism of the wavelength tunable laser 2. That is, it is necessary to synchronize amplitude, frequency, and phase of vibration of the reflector 11 of the optical amplifying element 1 with an amount of wavelength changes, frequency, and phase of the light emitted from the wavelength tunable laser 2. Therefore, when the MEMS-VCSEL is used as the wavelength tunable laser 2, a movable mirror of the MEMS-VCSEL and the reflector 11 of the optical amplifying element 1 have similar structures. In addition, a voltage signal that drives the movable mirror of the MEMS-VCSEL and a voltage signal that drives the reflector 11 of the optical amplifying element 1 may have identical amplitude, frequency, and phase.

Examples of a driving method of the reflector 11 include a driving method using electrostatic force, a driving method using a piezo-electric effect, and a driving method using expansion and contraction due to heat.

Preferred exemplary embodiments of the present invention will be described in more detail below with reference to the drawings. However, the present invention is not limited to these exemplary embodiments. It is to be noted that this specification describes the present invention in which a substrate side of the VCSEL is a lower side and an opposite side to the substrate is an upper side; however, these upper side and lower side do not necessarily correspond to upward and downward directions of the vertical direction.

First Exemplary Embodiment

Figure 2:
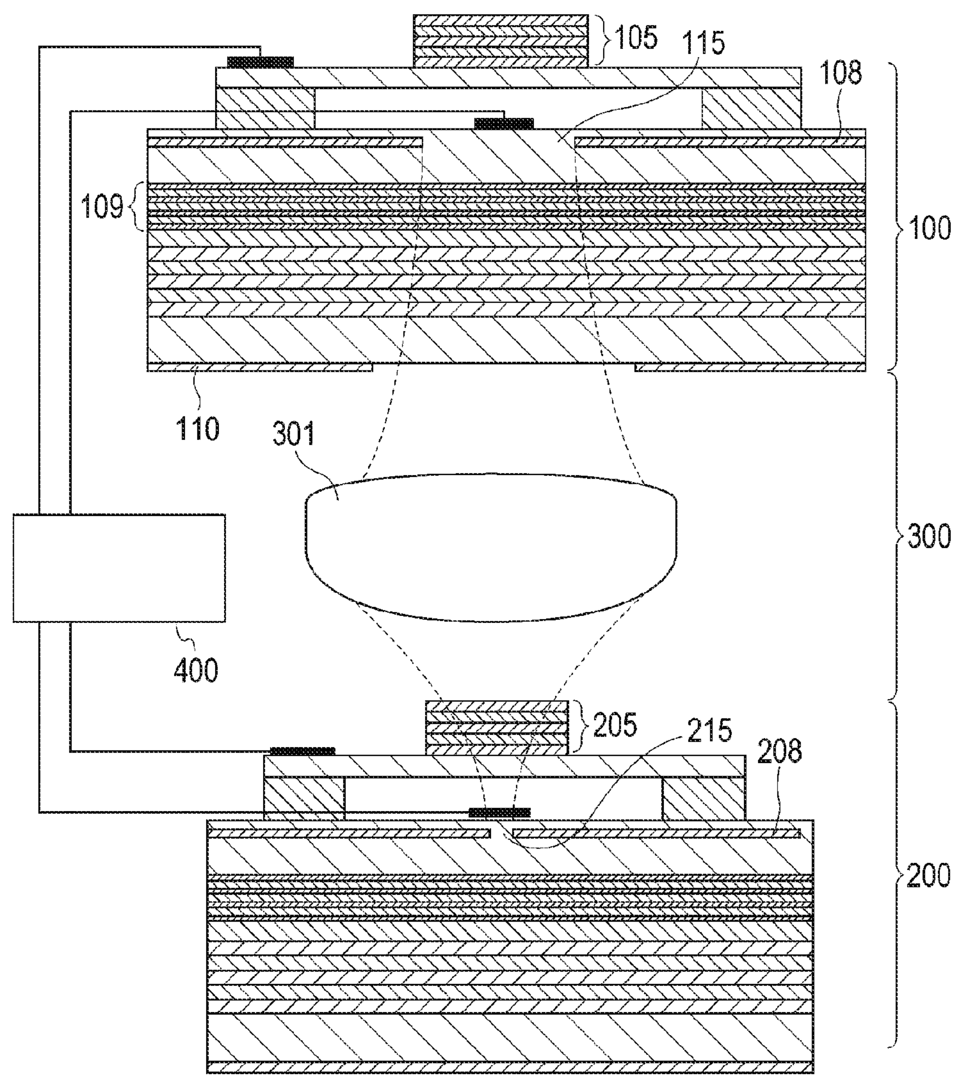
FIG. 2 is a schematic view illustrating one example of the light source device according to a first exemplary embodiment.

FIG. 2 is a schematic view illustrating one example of a light source device of the present exemplary embodiment. The light source device of the present exemplary embodiment includes a MEMS-VCSEL 200, an optical system 300, a MEMS-surface light-emitting SOA 100, and a control unit 400.

Figure 3A:
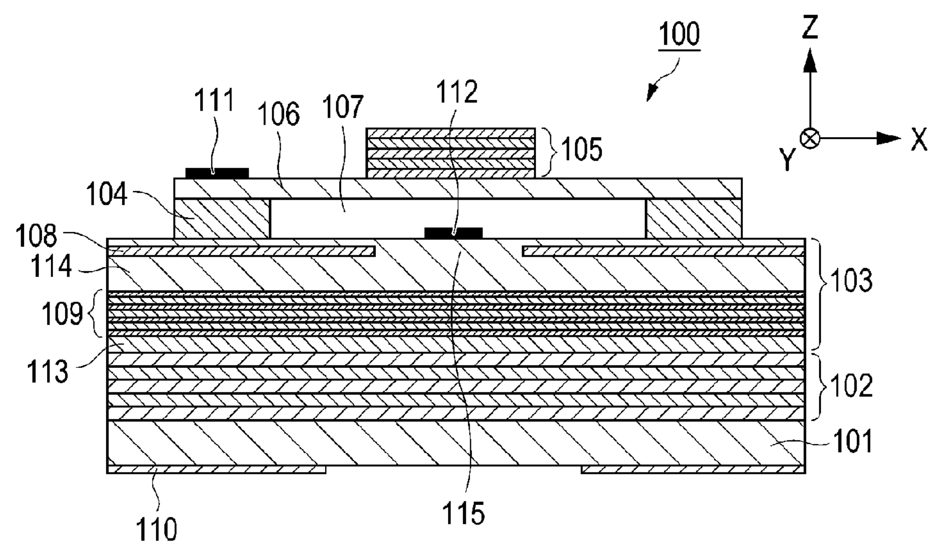
FIGS. 3A to 3B are each a schematic view illustrating one example of the optical amplifying element according to the first exemplary embodiment.
Figure 3B:
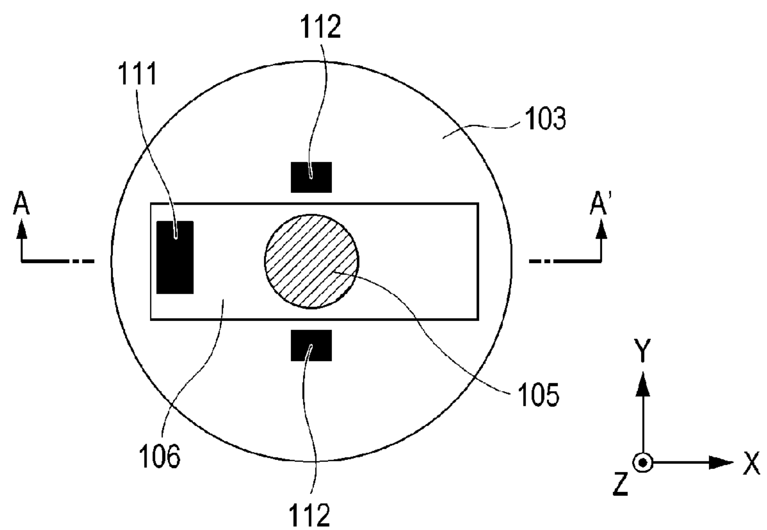

FIG. 3A is a schematic cross-sectional view of the MEMS-surface light-emitting SOA 100. FIG. 3B is a schematic top view of the MEMS-surface light-emitting SOA 100, and a cross section A-A' of FIG. 3B corresponds to FIG. 3A. The MEMS-surface light-emitting SOA 100 includes a first lower reflector 102, a first half-VCSEL 103, a first support layer (beam) 106, and a first upper reflector 105 in this order on a first substrate 101. The first upper reflector 105 is supported by the first support layer 106. The first support layer 106 is supported by a first support layer 104 on the first half-VCSEL 103. Here, a Z direction illustrated in FIG. 3A, 3B is a direction in which the first lower reflector 102, the first half-VCSEL 103, the first support layer 106, and the first upper reflector 105 are laminated. The Z direction is also a light emitting direction of the MEMS-surface light-emitting SOA 100. An XY in-plane direction is an in-plane direction that intersects the Z direction.

A first gap 107 is provided between the first support layer 106 and the first half-VCSEL 103. A first upper electrode 111 is formed on the first support layer 106. A first intermediate electrode 112 is formed on the first half-VCSEL 103. Although FIG. 3A is a cross section A-A' of FIG. 3B and cannot illustrate the first intermediate electrode 112, to assist a better understanding, FIG. 3A illustrates a case where the first intermediate electrode 112 is projected on the cross section A-A'.

The first support layer 106 is made of a member that has electric conductivity. Application of an alternating voltage between the first upper electrode 111 and the first intermediate electrode 112 causes the first support layer 106 to vibrate in the Z direction. As a result, the first upper reflector 105 also vibrates in the Z direction, which varies the cavity length of the pair of reflectors including the first upper reflector 105 and the first lower reflector 102.

The first half-VCSEL 103 includes a first lower spacer layer 113, a first active layer 109, and a first upper spacer layer 114 in this order from a first substrate 101 side. In addition, a first current confinement layer 108 is formed within the first upper spacer layer 114. A first low resistance region 115 of the first current confinement layer 108 corresponds to a light-emitting region of the MEMS-surface light-emitting SOA 100.

A first lower electrode 110 is disposed under the first substrate 101. This first lower electrode 110 includes a ring-shaped electrode in which an opening is provided to allow light emitted from the MEMS-VCSEL 200 to enter the MEMS-surface light-emitting SOA 100. The first lower electrode 110 may be a divided electrode instead of the ring-shaped electrode. An electric current is injected into the first half-VCSEL 103 via the first intermediate electrode 112 and the first lower electrode 110 to form population inversion in the first active layer 109. Using this population inversion, stimulated emission occurs within the first active layer 109 to amplify the light from the MEMS-VCSEL 200.

Figure 4A:
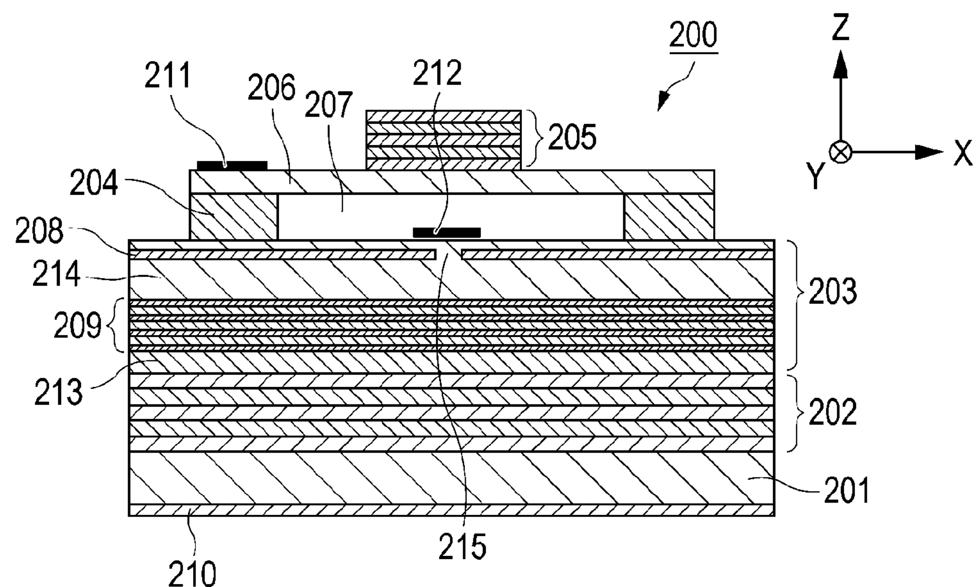
FIGS. 4A to 4B are each a schematic view illustrating one example of a wavelength tunable laser according to the first exemplary embodiment.
Figure 4B:
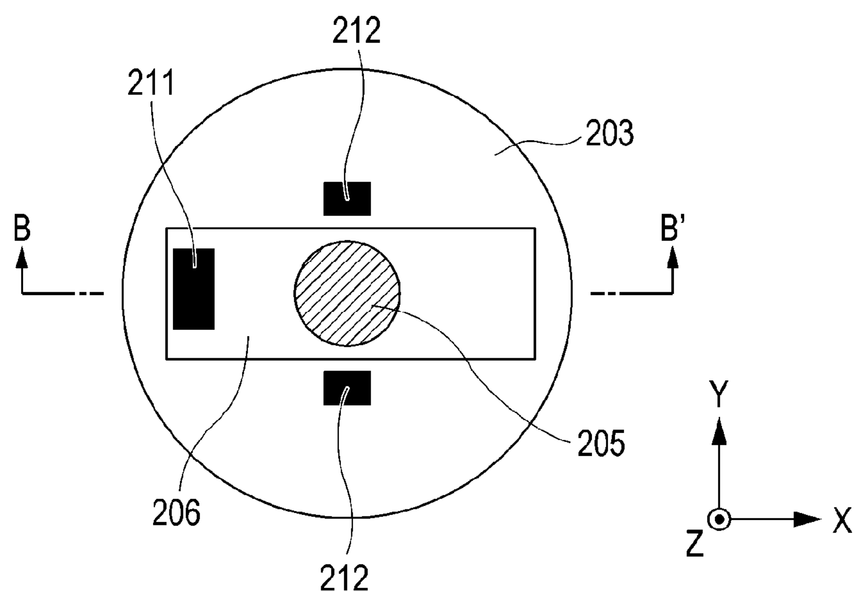

FIG. 4A is a schematic cross-sectional view of the MEMS-VCSEL 200. FIG. 4B is a schematic top view of the MEMS-VCSEL 200, and a cross section B-B' of FIG. 4B corresponds to FIG. 4A. The MEMS-VCSEL 200 includes a second lower reflector 202, a second half-VCSEL 203, a second support layer (beam) 206, and a second upper reflector 205 in this order on a second substrate 201. The second upper reflector 205 is supported by the second support layer 206. The second support layer 206 is supported by a second support layer 204 on the second half-VCSEL 203. Here, a Z direction illustrated in FIG. 4A, 4B is a direction in which the second lower reflector 202, the second half-VCSEL 203, the second support layer 206, and the second upper reflector 205 are laminated. The Z direction is also a light emitting direction of the MEMS-VCSEL 200. An XY in-plane direction is an in-plane direction that intersects the Z direction.

A second gap 207 is provided between the second support layer 206 and the second half-VCSEL 203. A second upper electrode 211 is formed on the second support layer 206. A second intermediate electrode 212 is formed on the second half-VCSEL 203. Although FIG. 4A is a cross section B-B' of FIG. 4B and cannot illustrate the second intermediate electrode 212, to assist a better understanding, FIG. 4A illustrates a case where the second intermediate electrode 212 is projected on the cross section A-A'.

The second half-VCSEL 203 includes a second lower spacer layer 213, a second active layer 209, and a second upper spacer layer 214 in this order from a second substrate 201 side. In addition, a second current confinement layer 208 is formed within the second upper spacer layer 214. A second low resistance region 215 of the second current confinement layer 208 corresponds to the light-emitting region of the MEMS-VCSEL 200.

A second lower electrode 210 is disposed under the second substrate 201. Application of a voltage between the second intermediate electrode 212 and the second lower electrode 210 causes electrons to be supplied from the second lower electrode 210 through the second substrate 201, the second lower reflector 202, and the second lower spacer layer 213 to the second active layer 209. Meanwhile, the application of the voltage causes holes to be supplied from the second intermediate electrode 212 through the second upper spacer layer 214 and the second low resistance region 215 of the second current confinement layer 208 to the second active layer 209. As a result, the electrons and the holes recombine in the second active layer 209 to emit light in the second active layer 209.

The second support layer 206 is made of a member that has electric conductivity. Application of an alternating voltage between the second upper electrode 211 and the second intermediate electrode 212 causes the second support layer 206 to vibrate in the Z direction. As a result, the second upper reflector 205 also vibrates in the Z direction, which varies the cavity length of the pair of reflectors including the second upper reflector 205 and the second lower reflector 202. As a result, of the light emitted in the second active layer 209, light with a specified wavelength according to the cavity length is emitted outside. This makes the oscillation wavelength of the MEMS-VCSEL 200 tunable.

As illustrated in FIG. 2, the first low resistance region 115 of the first current confinement layer 108 of the MEMS-surface light-emitting SOA 100 is larger than the second low resistance region 215 of the second current confinement layer 208 of the MEMS-VCSEL 200. For this reason, the light-emitting region of the MEMS-surface light-emitting SOA 100 is larger than the light-emitting region of the MEMS-VCSEL 200. This structure is preferable for the following reasons. Unlike an edge surface light-emitting amplifying element, a surface light-emitting laser and a surface light-emitting amplifying element have a short distance of the active layer through which light passes. In order to increase an amplification factor, the light-emitting region in the active layer 13 is preferably large. Specifically, the light-emitting region of the optical amplifying element 1 is preferably between 15 μm and 30 μm inclusive. Meanwhile, when the light-emitting region of the MEMS-VCSEL is enlarged, a transverse mode becomes a multimode, and the transverse mode of the light amplified and emitted from the optical amplifying element 1 also becomes a multimode. This impairs a coupling efficiency of an optical fiber in the following stage. Accordingly, the transverse mode of the MEMS-VCSEL is preferably a single mode. Therefore, the light-emitting region of the MEMS-VCSEL is preferably small, and is preferably between 2 μm and 10 μm inclusive.

Also, the optical system 300 maintains predetermined distances between a convex lens 301 and the MEMS- VCSEL 200, and between the convex lens 301 and the MEMS-surface light-emitting SOA 100. This optical system 300 enlarges a spot diameter to necessary magnification by causing the light emitted from the MEMS-VCSEL 200 to propagate through space, and to enter the MEMS-surface light-emitting SOA 100. Dotted lines of FIG. 2 schematically represent a change in the spot diameter of a propagating beam. Thus, the convex lens 301 collects the light so that a beam diameter in the first active layer 109 of the MEMS-surface light-emitting SOA 100 becomes larger than the beam diameter immediately after emission from the MEMS-VCSEL 200. That is, the MEMS-VCSEL 200 and the MEMS-surface light-emitting SOA 100 are disposed at positions of a beam waist. For example, the distance between the convex lens 301 and the MEMS-VCSEL 200 is set to 1.0 mm, whereas the distance between the convex lens 301 and the MEMS-surface light-emitting SOA 100 is set to 5.0 mm. Accordingly, the optical system 300 enlarges the beam diameter fivefold. This structure allows the light-emitting region of the MEMS-surface light-emitting SOA 100 to be larger than the light-emitting region of the MEMS-VCSEL 200. This structure allows, for example, amplification of output of the MEMS-VCSEL of about 5 mW to output exceeding 10 mW while the transverse mode is maintained in a single mode. For this purpose, the first lower electrode 110 has an opening for allowing the light from the MEMS-VCSEL 200 to enter the MEMS-surface light-emitting SOA 100. This opening is larger than the second low resistance region 215 of the second current confinement layer 208 of the MEMS-VCSEL 200.

The MEMS-surface light-emitting SOA 100 has a structure as illustrated in FIG. 3A in which the first lower reflector 102 and the first upper reflector 105 cause the light emitted from the MEMS-VCSEL 200 to resonate, and to increase the number of times of reciprocation within the first active layer 109. This improves a light amplification factor. Moreover, the cavity length is changed through driving of the first upper reflector 105 in the Z direction. For this reason, light with a specified wavelength is amplified by resonance, whereas light with other wavelengths is not amplified. This results in reduction in the ASE.

Therefore, as illustrated in FIG. 2, the control unit 400 controls driving of the first upper reflector 105 of the MEMS-surface light-emitting SOA 100 and driving of the second upper reflector 205 of the MEMS-VCSEL 200. The driving of the second upper reflector 205 of the MEMS-VCSEL 200 controls the oscillation wavelength of the MEMS-VCSEL 200, whereas the driving of the first upper reflector 105 controls the cavity length of the MEMS-surface light-emitting SOA 100. Accordingly, the control unit 400 synchronizes the voltage signals for driving the first upper reflector 105 and the second upper reflector 205 with each other. This control unit 400 includes so-called drivers, and includes a combination of electric circuits, ICs, and other components. The voltage signals for driving may be a sine wave, a sawtooth wave, and may be a shape of rectangle. As illustrated in FIG. 2, the control unit 400 may be configured to control current injection into the active layer of the MEMS-surface light-emitting SOA 100 and the active layer of the MEMS-VCSEL 200, and to perform laser oscillation and amplification (wiring is not illustrated).

Figure 5:
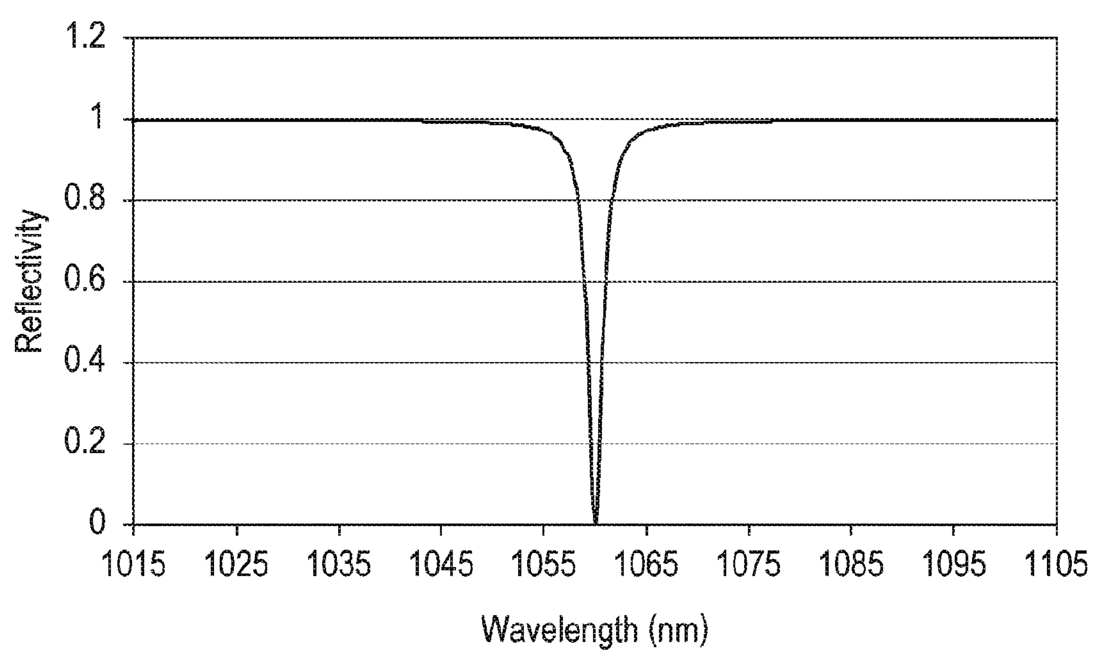
FIG. 5 is a schematic view illustrating reflectivity of the optical amplifying element according to the first exemplary embodiment.

As described above, the oscillation wavelength of the MEMS-VCSEL 200 and the resonant wavelength of the MEMS-surface light-emitting SOA 100 ideally agree with each other in a state of performing continuous sweeping with a sine wave. FIG. 5 illustrates wavelength dependency of a reflectivity spectrum of the light that enters the MEMS-surface light-emitting SOA 100 in a state where the first upper reflector 105 is not driven. Specifically, in the state where the first upper reflector 105 is not driven, FIG. 5 illustrates the reflectivity of the overall MEMS-surface light-emitting SOA 100 when the light enters from a side of the first substrate 101 of the MEMS-surface light-emitting type SOA 100. In FIG. 5, a maximum value of the reflectivity in a measured wavelength band is 1.

As illustrated in FIG. 5, in the state where the first upper reflector 105 is not driven, a section which is called a dip appears at the wavelength of about 1060 nm where the reflectivity is reduced than in other wavelength bands. A full width at half maximum of the dip is 1.87 nm. Also, since the wavelength of this dip corresponds to the cavity length of the MEMS-surface light-emitting SOA 100, the wavelength of the dip can be moved through driving of the first upper reflector 105. In other words, the dip is a wavelength with high transmittance.

When the wavelength of the light emitted from the MEMS-VCSEL 200 is within the full width at half maximum of this dip, the light is amplified by the MEMS-surface light-emitting SOA 100, and is emitted from the MEMS-surface light-emitting SOA 100. However, in the state where the first upper reflector 105 is not driven, for example, when the wavelength of the light emitted from the MEMS-VCSEL 200 is 1045 nm, the reflectivity of the MEMS-surface light-emitting SOA 100 is large, and thus almost no light is emitted from the MEMS-surface light-emitting SOA 100. For this reason, an absolute value of a wavelength difference between the wavelength of the dip of the MEMS-surface light-emitting SOA 100 and the oscillation wavelength of the MEMS-VCSEL 200 is preferably 0.94 nm or less, which is half of the full width at half maximum of the dip in the reflectivity spectrum of the MEMS-surface light-emitting SOA 100. This structure allows the oscillation wavelength of the MEMS-VCSEL 200 to be efficiently amplified by the MEMS-surface light-emitting SOA 100, and to be efficiently emitted from the MEMS-surface light-emitting SOA 100. At this dip wavelength, the light emitted from the MEMS-VCSEL 200 stays within the cavity for 0.32 ps, reciprocates in the cavity during this period, passes through the first active layer 109 multiple times, and is thus amplified by stimulated emission. A figure of 0.32 ps corresponds to $\tau$ in the following Equation 1. $\tau$ is a photon lifetime within the cavity. In Equation 1, Q is a Q value of the cavity. $\omega_0$ is a resonance frequency of the cavity. $\lambda_0$ is a resonant wavelength of the cavity and represents the wavelength of the dip. $\Delta\lambda$ represents the full width at half maximum of the dip. $\Delta\omega$ is the full width at half maximum in a frequency region corresponding to the full width at half maximum of the dip.

$$Q=\omega_0\tau=\lambda 0/\Delta\lambda\cong\omega_0/\Delta\omega \qquad \text{Equation 1}$$

Here, since $\omega_0$ is sufficiently larger than $\Delta\omega$, $\lambda 0/\Delta\lambda$ can be approximated with $\omega_0/\Delta\omega$.

In order to implement this structure, for example, the structure of cavity length, support layer, and upper reflector may be made identical between the MEMS-surface light-emitting SOA 100 and the MEMS-VCSEL 200, and the drive voltage signals from the control unit 400 to respective support layers may have identical phase, identical amplitude, and identical frequency. This structure can drive the first support layer 106 and the second support layer 206 so that the oscillation wavelength of the MEMS-VCSEL 200 is within the full width at half maximum of the dip.

However, even if a variation waveform of the oscillation wavelength of the MEMS-VCSEL 200 is in phase with a variation waveform of the resonant wavelength of the MEMS-surface light-emitting SOA 100 in an initial state, a change in physical properties of the MEMS due to a time-dependent change may generate a phase difference in the variation waveform. When the phase difference is generated, the oscillation wavelength of the MEMS-VCSEL 200 will deviate from the dip of the reflectivity spectrum of the MEMS-surface light-emitting SOA 100. Accordingly, the reflectivity of the MEMS-surface light-emitting SOA 100 increases, and the light is no longer emitted from the MEMS-surface light-emitting SOA 100.

Therefore, the control unit 400 has a function to detect and correct the phase difference regularly. Specifically, the control unit 400 performs the correction by the following method. First, the control unit 400 injects a constant electric current into the active layer of the MEMS-VCSEL 200 and the active layer of the MEMS-surface light-emitting SOA 100 for driving. In this state, the control unit 400 applies a sine-wave voltage signal to each support layer. In this state, the control unit 400 adjusts the phase difference between the sine-wave voltage signals applied to the two support layers while measuring optical output that is output from the MEMS-surface light-emitting SOA 100. The control unit 400 then acquires the phase difference between the sine-wave voltage signals applied to the two support layers with maximized optical output from the MEMS-surface light-emitting SOA 100. The state with the maximized optical output is the state where the dip in the reflectivity spectrum of the MEMS-surface light-emitting SOA 100 and the resonant wavelength of the MEMS-VCSEL 200 are closest. Accordingly, this phase difference is stored as an optimal phase difference, and is used for subsequent driving of the two support layers.

In addition to the phase difference, amplitude of the support layer may also change over time. Accordingly, the control unit 400 also adjusts the amplitude regularly by the following method. First, the control unit 400 confirms that the MEMS-VCSEL 200 performs sweeping of the necessary wavelength band by using a temporal waveform of interfering light of an OCT system. When the MEMS-VCSEL 200 fails to sweep the necessary wavelength band, the control unit 400 increases the voltage for driving the support layer to obtain the necessary sweep band. Next, in the state where the MEMS-VCSEL 200 is sweeping the necessary sweep band, the control unit 400 changes the voltage for sweeping the support layer of the MEMS-surface light-emitting SOA100. The control unit 400 then stores the voltage where optical output is maximized near both ends on a short wavelength side and a long wavelength side of the sweep band. Since this voltage is an optimum value, this value is used for subsequent driving.

(Upper Reflector and Lower Reflector)

The upper reflector and the lower reflector include, for example, distributed Bragg reflectors (hereinafter referred to as DBR) in which high refractive index layers and low refractive index layers are alternately laminated by ¼ wavelength of optical thickness. In order to widen a wavelength tunable range, each of the reflectors preferably has high reflectivity in a broad band as broad as possible. Either one of the DBR including semiconductors and the DBR including dielectric substances may be used for the upper reflector and the lower reflector. In general, the DBR including dielectric substances can have a larger refractive index difference between the high refractive index layer and the low refractive index layer than the DBR including semiconductors, and can implement high reflectivity with a small number of stacked layers. On the other hand, the DBR including semiconductors, which needs a larger number of pairs, has an advantage in terms of process in that film deposition can be performed simultaneously during crystal growth and that an electric current can be passed by doping. In addition, the DBR including semiconductors can be used as a support layer.

Although the semiconductor DBR can be used for both the lower reflector and the upper reflector in order to form the lower reflector and the upper reflector collectively by epitaxial growth, the dielectric DBR may be used for the upper reflector to obtain high reflectivity in a broader band. It is to be noted that when the dielectric DBR is used for the upper reflector, the dielectric DBR can be formed on the semiconductor layer. Examples of the material for the upper reflector include $Al_{0.4}Ga_{0.6}As$ and $Al_{0.9}Ga_{0.1}As$ for the semiconductor DBR, and silicon oxide and titanium oxide for the dielectric DBR. GaAs and AlAs can be used for the lower reflector.

In addition, High Index Contrast Subwavelength Grating (hereinafter referred to as HCG) may be used for the reflector. The HCG is a structure in which high refractive index materials and low refractive index materials are alternately arranged periodically in an in-plane direction. Examples of the HCG include a periodic structural body of a high refractive index region (AlGaAs section) and a low refractive index region (gap) in which a semiconductor layer such as an AlGaAs layer is processed and periodic gaps are provided. From an aspect of performing high-speed wavelength tuning, the upper reflector, which is a movable mirror, needs to be a lightweight reflector, and preferably uses the HCG. It is to be noted that HCG described in U.S. Pat. No. 8,059,690 and U.S. Pat. No. 8,189,643 can be used.

Preferably, the upper reflector and the lower reflector of the MEMS-surface light-emitting SOA 100 have the reflectivity smaller than the reflectivity of the lower reflector which is not on a light emission side of the MEMS-VCSEL.

(Support Layer (Beam))

The support layer (beam) may be supported in two support regions, and may be supported in three or more support regions. Also, the support layer may have a structure supported in one region like a silicon cantilever. Also, the support layer may have a structure formed for relieving distortion made during crystal growth, stress originating from operating environment temperature, and other factors.

The support layer is not particularly limited as long as the support layer can change the cavity length. For example, the support layer may be driven by electrostatic force as described in the present exemplary embodiment, and may be driven mechanically using a piezoelectric material.

The support layer may also function as the upper reflector, and may be configured separately from the upper reflector as in the present exemplary embodiment. In the latter case, the upper reflector may be disposed at a position corresponding to the light-emitting portion of the support layer, that is, at a position corresponding to the light-emitting region, and the upper reflector may be disposed above or below the support layer. Also, a through hole may be formed at the position corresponding to the light-emitting region of the support layer, and the upper reflector may be disposed in the through hole. When the support layer and the upper reflector have different bodies, patterning of the upper reflector may be formed before patterning of a support layer precursor layer by a manufacturing method described later.

(Upper Spacer Layer and Lower Spacer Layer)

The upper spacer layer and the lower spacer layer may be made of an identical semiconductor material, and may be made of different semiconductor materials. GaAs, AlGaAs, and other semiconductor materials can be used.

The upper spacer layer and the lower spacer layer have electric conductivity. For example, a p-type semiconductor is doped with proper quantity of acceptor, such as Mg. On the other hand, an n-type semiconductor is doped with proper quantity of donor, such as Si. Also, each of the upper spacer layer and the lower spacer layer may include a monolayer, and may include two or more layers.

(Active Layer)

A material for the active layer is not particularly limited as long as the material emits light by injection of an electric current. For emitting light with a wavelength band near 850 nm, a material having a quantum well structure including $Al_nGa_{1-n}As$ ($0 \leq n \leq 1$) can be used. Also, for emitting light with a wavelength band near 1060 nm, a material including $In_nGa_{1-n}As$ ($0 \leq n \leq 1$) can be used.

Preferably, the active layer has sufficiently broad gain, and specifically, the active layer preferably has gain in a wavelength range broader than a reflection band of the upper reflector and the lower reflector. Examples of such an active layer include an active layer that has a quantum well structure capable of emitting light in at least two or more different energy levels, so-called asymmetrical quantum well structure. Also, the quantum well structure may include a plurality of layers so as to have a single quantum well or multiplex quantum well. Materials and structures of the active layer in the present exemplary embodiment can be properly selected according to the wavelength at which oscillation should occur.

(Current Confinement Layer)

The current confinement layer is formed including a high resistance portion, an oxidized region which is oxidized selectively by a selective oxidation process, and a low resistance portion, a non-oxidized region which is not oxidized. The oxidized layer that becomes the current confinement layer by the selective oxidation process is preferably an AlAs layer or a layer with a high Al composition ratio, for example, an $Al_{0.98}Ga_{0.02}$ layer. Selective oxidation of the current confinement layer in a high-temperature water-vapor atmosphere leads to formation of $Al_xO_y$ and formation of a current confinement structure. A light-emitting shape can be controlled by controlling a shape of the non-oxidized region. A size of the non-oxidized region formed in the light-emitting portion, that is, the light-emitting region is about 5 μm to 15 μm. Also, in a region between the light emitting portion and the support region, the current confinement layer is an oxidized region that is selectively oxidized so that a leakage current is not generated. The non-oxidized region is surrounded by the oxidized region.

Also, a position of the current confinement layer may be on an upper side or lower side of the active layer, as long as the current confinement layer is located between a contact layer and the lower reflector. Also, a plurality of the current confinement layers may be provided. In that case, the plurality of current confinement layers may be in one of the upper side and the lower side of the active layer, and may be in both of the upper side and the lower side.

(Gap)

Normally, no solid body exists in the gap. Accordingly, the gap may be a vacuum according to its atmosphere, and a fluid may exist in the gap, such as air, inert gas, and liquid like water. It is to be noted that a length of the gap in a thickness direction of a structural body can be determined in consideration of a wavelength tunable bandwidth or pull-in of a movable reflector. For example, when performing tuning in the wavelength tunable bandwidth of 100 nm centered at 1060 nm with an air gap, the length of the gap is about 2 μm.

(Upper Electrode, Intermediate Electrode, and Lower Electrode)

As the upper electrode, intermediate electrode, and lower electrode, a single-element metal such as titanium and gold, alloy, or laminated metal films can be used. For example, Ti/Au or AuGe/Ni/Au can be used as an electrode material. Also, when electrostatic attractive force is exerted between the support layer and the intermediate electrode to drive the support layer, the upper electrode does not need to be disposed in the support region of the support layer, and may be disposed in a movable portion. The lower electrode may be disposed on an upper side of the lower reflector instead of on a lower side of the lower reflector if carriers can be injected.

Second Exemplary Embodiment

Figure 6:
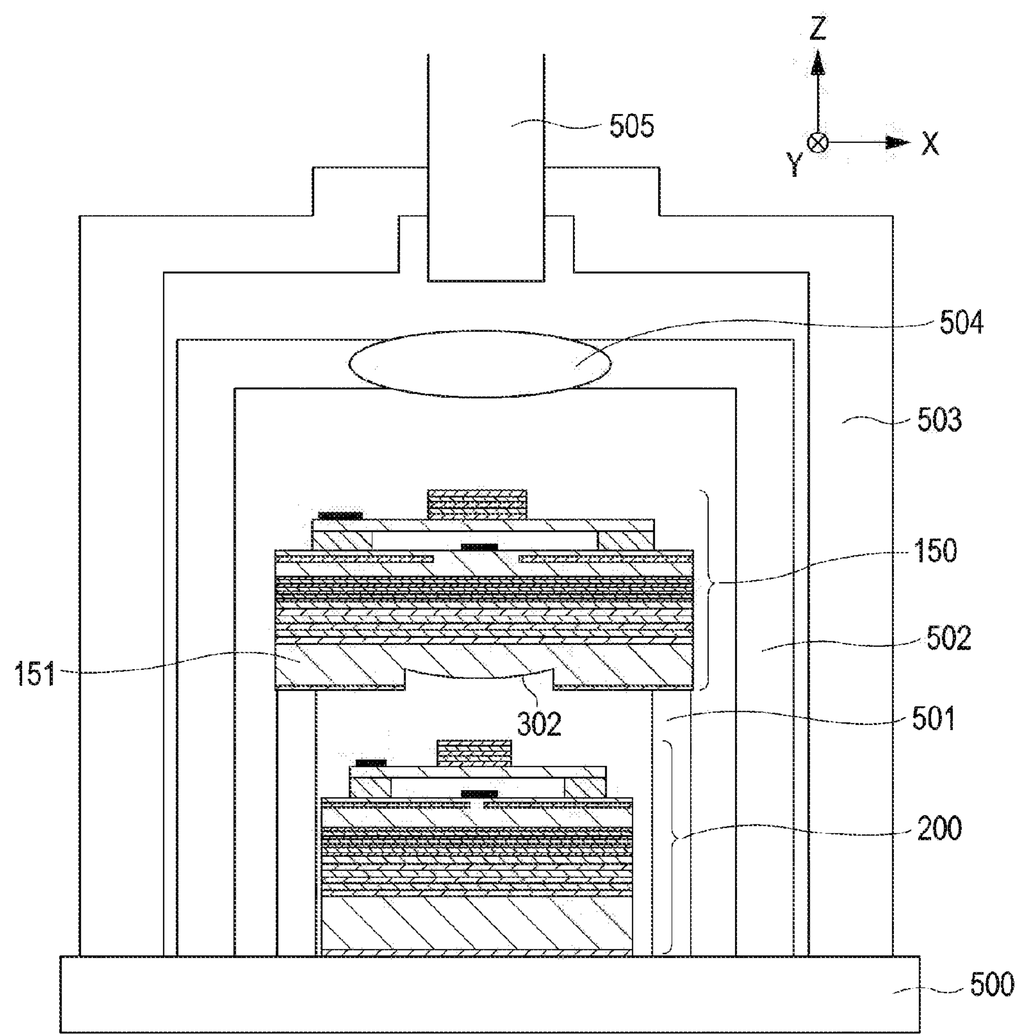
FIG. 6 is a schematic view illustrating one example of the light source device according to a second exemplary embodiment.

FIG. 6 is a schematic cross-sectional view of one example of a light source device according to the present exemplary embodiment. The light source device according to the present exemplary embodiment is an example of structure in which a MEMS-VCSEL 200 and a MEMS-surface light-emitting SOA 150 are integrated in one CAN package (hereinafter referred to as CANpkg). The MEMS-VCSEL 200 has a structure identical to the structure described in the first exemplary embodiment. The MEMS-surface light-emitting SOA 150 differs from the MEMS-surface light-emitting SOA 100 described in the first exemplary embodiment in the following points. That is, the MEMS-surface light-emitting SOA 150 includes a convex lens surface 302 formed on a surface of a first substrate 151 that receives light from the MEMS-VCSEL 200. In other points, the MEMS-surface light-emitting SOA 150 is identical to the MEMS-surface light-emitting SOA 100 described in the first exemplary embodiment. This convex lens surface 302 has a function similar to the function of the convex lens 301 of FIG. 2. The CANpkg is commonly used, for example, as optical mounting of VCSEL.

According to the present exemplary embodiment, the MEMS-VCSEL 200 and a cylindrical spacer 501 are disposed on a base 500 of the CANpkg, and the MEMS-surface light-emitting SOA 150 is disposed in an upper part of the spacer 501. In addition, a cap 502 fixed to the base 500 is disposed so as to cover the MEMS-VCSEL 200 and the MEMS-surface light-emitting SOA 150. In addition, a fiber holding member 503 is disposed so as to cover the cap 502. An optical fiber 505 is held by the fiber holding member 503. Light emitted from the MEMS-surface light-emitting SOA 150 enters a lens 504 held by the cap 502, and is collected into the optical fiber 505 held by the fiber holding member 503.

The spacer 501 functions to maintain a constant distance between a light-emitting surface of the MEMS-VCSEL 200 and the MEMS-surface light-emitting SOA 150, and is made of Si, for example. In addition, the spacer 501 functions to maintain an upper surface of the MEMS-VCSEL 200 and a lower surface of the MEMS-surface light-emitting SOA 150 parallel with each other. The spacer 501 determines the distance between the upper surface of the MEMS-VCSEL 200 and the lower surface of the MEMS-surface light-emitting SOA 150, and a relative slope of the two surfaces. This reduces the number of parameters to control during mounting and assembly, reduces mounting time, and improves yields in the present exemplary embodiment.

The convex lens surface 302 of the MEMS-surface light-emitting SOA 150 has a function to enlarge curvature of a wave front of the light from the MEMS-VCSEL 200, and to make the light almost parallel. In addition, the convex lens surface 302 causes the parallel light to enter half-VCSEL of the MEMS-surface light-emitting SOA 150.

In the present exemplary embodiment, the control unit 400 identical to the control unit 400 of the first exemplary embodiment is used (not illustrated). The base 500 of the CANpkg includes an electrode lead (not illustrated) that penetrates the base 500. In addition, a wire (not illustrated) electrically connects the electrode lead to the MEMS-VCSEL 200 and the MEMS-surface light-emitting SOA 150. Through the electrode lead and the wire, an electric signal of the control unit 400 is input into the MEMS-VCSEL 200 and the MEMS-surface light-emitting SOA 150 for driving in a similar manner to the first exemplary embodiment. Detailed driving is similar to the driving in the first exemplary embodiment, and thus will be omitted. Also, electric wiring within the CANpkg is also similar to wiring in a general CANpkg, and thus will be omitted.

As compared with the first exemplary embodiment, the light source device according to the present exemplary embodiment is configured such that, instead of the convex lens 301, the convex lens surface 302 is formed on a lower surface of the first substrate 151, which provides an effect of downsizing. Also, of total production costs of a laser light source, the mounting cost is large in general and may account for 50% or more of the total production costs. According to the present exemplary embodiment, the general CANpkg contains all members, and the number of pkg is one, which allows significant cost reduction.

The MEMS-VCSEL 200 is directly fixed on the base 500 of the CANpkg. The MEMS-surface light-emitting SOA 150 is fixed to the base 500 of the CANpkg via the spacer 501 disposed on the base 500 of the CANpkg. This causes almost no displacement after fixation. Moreover, the convex lens surface 302 is produced with photolithographic accuracy of semiconductor processes on the lower surface of a substrate of the MEMS-surface light-emitting SOA 150, eliminating the need for alignment of the convex lens surface 302 with the MEMS-surface light-emitting SOA 150. Accordingly, the alignment is performed only in the in-plane direction of the MEMS-VCSEL 200 and the MEMS-surface light-emitting SOA 150, which facilitates the alignment. This leads to low cost production and good mechanical stability of the elements.

Light may be reflected by the MEMS-surface light-emitting SOA 150 and returned to the MEMS-VCSEL 200. The light returned to the MEMS-VCSEL 200 may unstabilize characteristics as a light source. In order to reduce the returned light, the wave front of the returned light from the MEMS-surface light-emitting SOA 150 after being transmitted through the convex lens surface 302 may have intentional curvature. This causes the returned light from the MEMS-surface light-emitting SOA 150 when reaching the MEMS-VCSEL 200 to have a beam spot diameter different from the spot diameter when the light is emitted from the MEMS-VCSEL 200. Even if light power of the returned light is identical, the different spot diameter allows decrease in coupling efficiency to an oscillation mode of the MEMS-VCSEL 200, resulting in inhibited influence of the returned light. One of the structures with intentional curvature in the wave front can be implemented by shifting a position of the lower reflector of the MEMS-surface light-emitting SOA 150 from a beam waist position of the beam that passes through the lens.

Third Exemplary Embodiment

Figure 7:
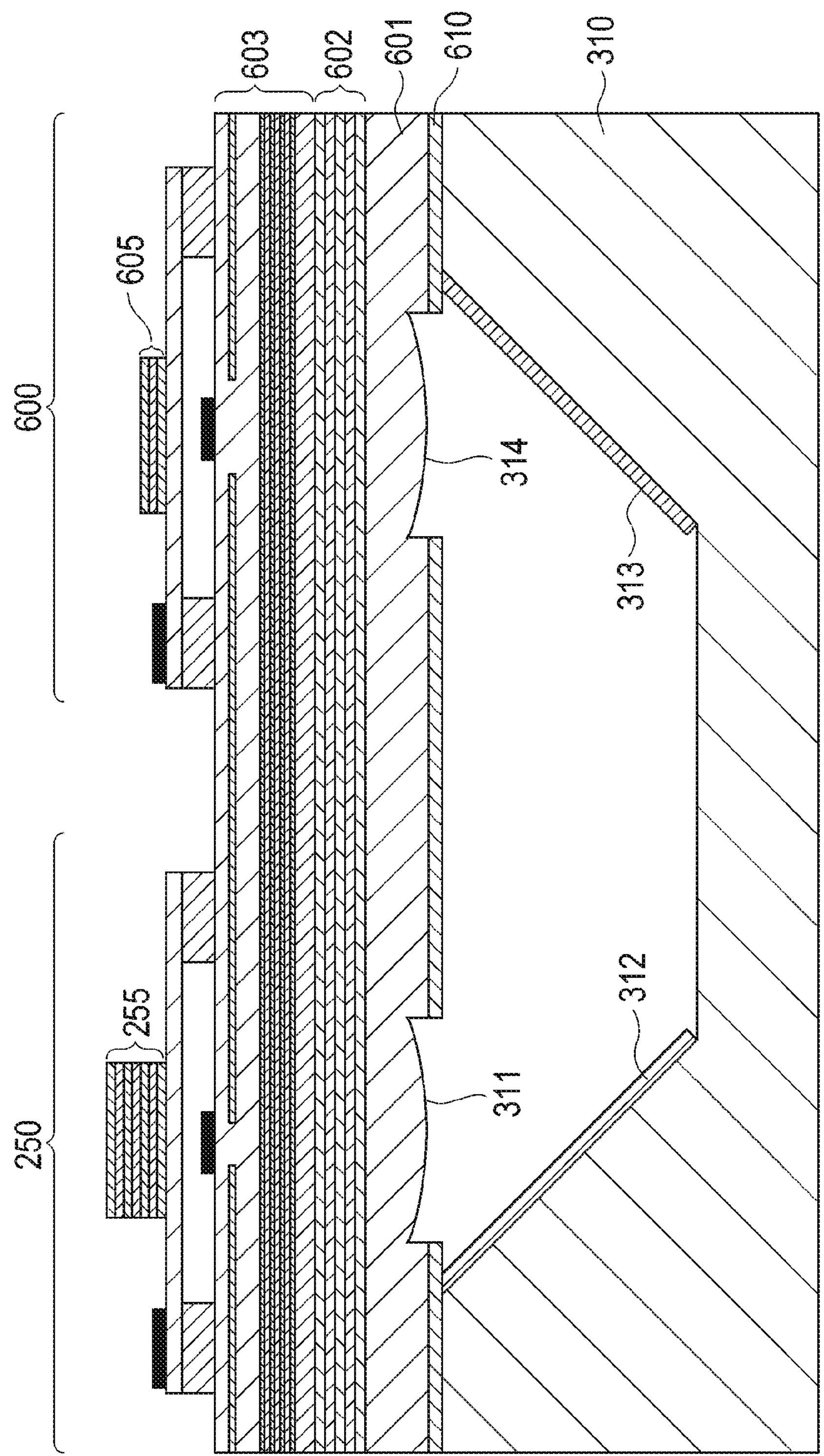
FIG. 7 is a schematic view illustrating one example of the light source device according to a third exemplary embodiment.

FIG. 7 is a schematic cross-sectional view illustrating one example of a light source device according to the present exemplary embodiment. The light source device according to the present exemplary embodiment has a structure in which a MEMS-VCSEL 250 and a MEMS-surface light-emitting SOA 600 are monolithically formed in an XY in-plane direction on an identical substrate 601. The MEMS-VCSEL 250 and the MEMS-surface light-emitting SOA 600 include a half-VCSEL 603 including a common active layer, a common lower reflector 602, and a common lower electrode 610.

Reflectivity of a second upper reflector 255 of the MEMS-VCSEL 250 is higher than reflectivity of the common lower reflector 602, and the reflectivity is 99.9% or more. Meanwhile, the reflectivity of the common lower reflector 602 is 99.0% or less. Accordingly, light generated in the MEMS-VCSEL 250 is emitted from the lower reflector 602.

Preferably, the reflectivity of a first upper reflector 605 of the MEMS-surface light-emitting SOA 600 is identical to or less than the reflectivity of the common lower reflector 602. Also, the reflectivity of the first upper reflector 605 of the MEMS-surface light-emitting SOA 600 is lower than the reflectivity of the second upper reflector 255 of the MEMS-VCSEL 250. In order to satisfy this reflectivity relationship, the first upper reflector 605 and the second upper reflector 255 may each include DBR, and adjustment may be made by changing the total number of DBR layers.

The lower electrode 610 has an opening so as to emit light therethrough from the MEMS-VCSEL 250. In addition, in a similar manner to the first and second exemplary embodiments, the lower electrode 610 has an opening so that light enters the MEMS-surface light-emitting SOA 600. The lower electrode 610 may have a structure in which light is emitted from the MEMS-VCSEL 250 and light enters the MEMS-surface light-emitting SOA 600, and may be a divided electrode.

A chip 310 having reflective surfaces 312, 313 is disposed under a substrate 601. The reflective surfaces 312, 313 are made of a metal film with a flat surface. The reflective surface 312 is disposed sloped with respect to a Z direction on the chip 310 so as to reflect, in a +X direction, the light emitted in a −Z direction from the MEMS-VCSEL 250. On the other hand, the reflective surface 313 is disposed sloped with respect to the Z direction so as to reflect, in the +Z direction, the light that is reflected by the reflective surface 312 and travels in the +X direction.

Moreover, convex lens surfaces 311, 314 having curvature are formed in the MEMS-VCSEL 250 and the MEMS-surface light-emitting SOA 600.

This structure causes the light emitted from the convex lens surface 311 of the MEMS-VCSEL 250 to be reflected 90 degrees by each of the reflective surfaces 312, 313, and to enter the MEMS-surface light-emitting SOA 600 from the convex lens surface 314 of the MEMS-surface light-emitting SOA 600. The light is then amplified while resonating in the MEMS-surface light-emitting SOA 600, and is emitted upward from the MEMS-surface light-emitting SOA 600 through the first upper reflector 605.

According to the present exemplary embodiment, the convex lens surface 311 of the MEMS-VCSEL 250, the convex lens surface 314 of the MEMS-surface light-emitting SOA 600, and the reflective surfaces 312, 313 can be aligned with photolithographic accuracy of semiconductor processes. This can make the mounting process easier than in the first exemplary embodiment. This can also make the light source device smaller than in the first exemplary embodiment.

Regarding packages, the CANpkg as described in the second exemplary embodiment may be used, and other packages may be used.

Also, in the present exemplary embodiment, the light source device may include three or more reflective surfaces instead of two reflective surfaces. For example, the light source device may include another reflective surface under the lower electrode 610 so that, through the three reflective surfaces, the light emitted from the MEMS-VCSEL 250 may enter the MEMS-surface light-emitting SOA. In this case, the lower electrode 610 may also function as a reflective surface that propagates the light. Also, the reflective surfaces 312, 313 may be connected to each other.

Fourth Exemplary Embodiment

Figure 8:
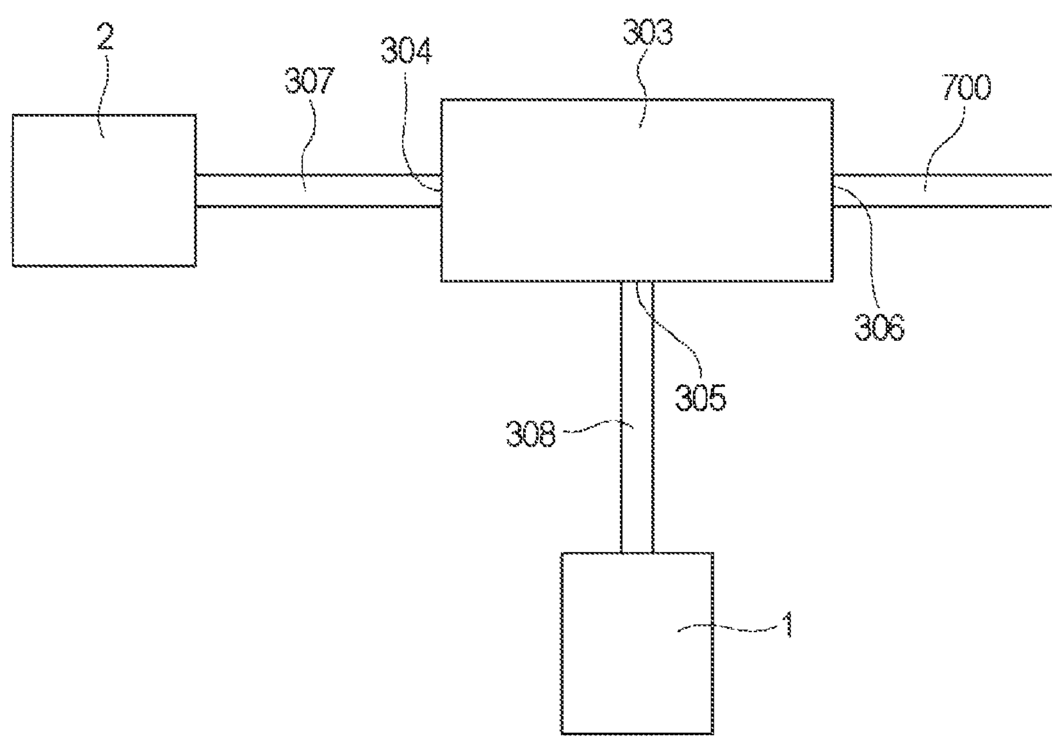
FIG. 8 is a schematic view illustrating one example of the light source device according to a fourth exemplary embodiment.

FIG. 8 is a schematic view illustrating one example of a light source device according to the present exemplary embodiment. The present exemplary embodiment has a structure to further reduce returned light from an optical amplifying element 1 to a wavelength tunable laser 2. The light source device according to the present exemplary embodiment includes a circulator 303 in addition to the wavelength tunable laser 2 and the optical amplifying element 1. The circulator 303 has three ports. The circulator 303 has a characteristic such that light that enters a first port 304 is emitted from a second port 305, and light that enters the second port is emitted from a third port 306. The light that enters the first port 304 from the second port 305 is −20 dB or less with respect to the light that enters the third port 306 from the second port 305. For this reason, the light that enters the circulator 303 from the second port 305 hardly returns to the first port 304.

The wavelength tunable laser 2 is optically connected to the first port 304 of the circulator 303 via an optical fiber 307. The optical amplifying element 1 is optically connected to the second port 305 of the circulator 303 via an optical fiber 308. An optical fiber 700 is optically connected to the third port 306 of the circulator 303.

The light emitted from the wavelength tunable laser 2 passes through the optical fiber 307 and enters the first port 304 of the circulator 303. The light that enters the first port 304 of the circulator 303 passes through the optical fiber 308 connected to the second port 305 and enters the optical amplifying element 1. The light that enters the optical amplifying element 1 is amplified by the optical amplifying element 1, passes through the optical fiber 308 again, and enters the second port 305 of the circulator 303. The light that enters the second port 305 of the circulator 303 hardly goes to the first port 304, but enters the third port 306 and is emitted from the optical fiber 700. Thus, the light emitted from the wavelength tunable laser 2 is emitted from the circulator 303 through the first port 304, the second port 305, the optical amplifying element 1, the second port 305, and the third port 306 in this order. According to the present exemplary embodiment, using the circulator 303 allows reduction in the returned light from the optical amplifying element 1 to the wavelength tunable laser 2.

The MEMS-VCSEL 200 described in the first and second exemplary embodiments can be used as the wavelength tunable laser 2. The optical amplifying element 1 has a structure in which an incident surface and an emission surface are identical, partly different from the MEMS-surface light-emitting SOA described in the first and second exemplary embodiments. In this structure, for example, in the MEMS-surface light-emitting SOA 100 described in the first exemplary embodiment, reflectivity of the first lower reflector 102 may be set to 99.9% or more, and reflectivity of the first upper reflector 105 may be set to about 99.0%. Also, it is not necessary to form an opening in the first lower electrode 110 disposed under the first substrate 101, as in the first exemplary embodiment.

According to the present exemplary embodiment, the optical amplifying element 1 and the wavelength tunable laser 2 may be put into separate packages, and may be put into one package. Also, the optical amplifying element 1, the wavelength tunable laser 2, and the circulator 303 may be put into one package.

Fifth Exemplary Embodiment

The present exemplary embodiment describes an example of an information acquisition apparatus that uses the light source device according to any one of the first to fourth exemplary embodiments. A wavelength tunable light source device can be used as a light source for optical communications or a light source for light measurement. Furthermore, the wavelength tunable light source device can be used as a light source device of an information acquisition apparatus that acquires internal information on a measurement object noninvasively and nondestructively. The following describes an optical coherence tomography apparatus (hereinafter referred to as an OCT apparatus) as one example of the information acquisition apparatus that uses the light source device of the present exemplary embodiment with reference to FIG. 9.

Figure 9:
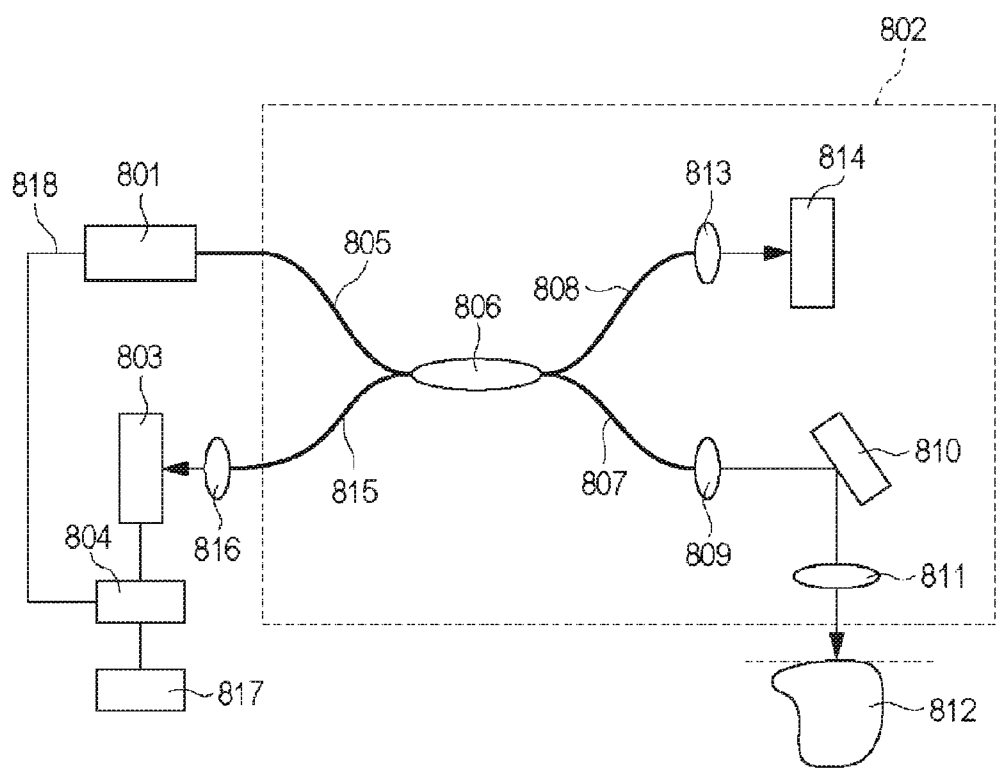
FIG. 9 is a schematic view illustrating one example of an image pickup device according to a fifth exemplary embodiment.

FIG. 9 is a schematic view illustrating the OCT apparatus according to the present exemplary embodiment. The OCT apparatus includes at least a light source device 801, an interference optical system 802, a light detection unit 803, and an information acquisition unit 804 that acquires internal information on a measurement object. As the light source device 801, the laser device according to any one of the first to third exemplary embodiments can be used. In addition, although not illustrated, the information acquisition unit 804 includes a Fourier transform device. Here, the Fourier transform device included in the information acquisition unit 804 is not limited to any specified form as long as the information acquisition unit 804 has a function to perform Fourier transform on input data. In one example, the information acquisition unit 804 includes an arithmetic operation unit, and this arithmetic operation unit has a function to perform Fourier transform. Specifically, this is a case where the arithmetic operation unit is a computer having a CPU, and this computer executes an application that has a Fourier transform function. In another example, the information acquisition unit 804 includes a Fourier transform circuit that has a Fourier transform function.

Light emitted from the light source device 801 passes through the interference optical system 802 and is output as interfering light that has information on a measurement object body 812. The interfering light is received by the light detection unit 803. Here, the light detection unit 803 may be a differential detection unit, and may be a simple intensity monitoring detection unit. Information on a temporal waveform of intensity of the received interfering light is sent from the light detection unit 803 to the information acquisition unit 804. The information acquisition unit 804 acquires a peak value of the temporal waveform of intensity of the received interfering light, performs Fourier transform, and acquires information on the body 812 (for example, information on a tomogram). It is to be noted that the light source device 801, the interference optical system 802, the light detection unit 803, and the information acquisition unit 804 mentioned here can be provided arbitrarily.

The following describes in detail a process after the light is projected from the light source device 801 until the internal information on the measurement object body is obtained. The light emitted from the light source device 801 passes through a fiber 805, enters a coupler 806, and branches into projection light that passes through a fiber 807 for projection light and into reference light that passes through a fiber 808 for reference light. The coupler 806 includes a coupler that performs single mode operations in a wavelength band of the light source, and various fiber couplers include 3 dB couplers. The projection light passes through a collimator 809, becomes parallel light, and is reflected by a mirror 810. The light reflected by the mirror 810 passes through a lens 811, is projected on the body 812, and is reflected from each layer in a depth direction of the body 812.

On the other hand, the reference light passes through a collimator 813 and is reflected by a mirror 814. In the coupler 806, interfering light is generated from the reflected light from the body 812 and the reflected light from the mirror 814. The interfering light passes through a fiber 815, passes through and is collected in a collimator 816, and is received by the light detection unit 803. Information on intensity of the interfering light received by the light detection unit 803 is converted into electric information, such as a voltage, and is sent to the information acquisition unit 804. The information acquisition unit 804 processes intensity data of the interfering light, specifically performs Fourier transform, and then obtains information on a tomogram. The intensity data of the interfering light to undergo Fourier transform is normally data sampled at equal wavenumber intervals; however, data sampled at equal wavelength intervals can also be used.

The obtained information on a tomogram may be sent from the information acquisition unit 804 to an image display unit 817 to be displayed as an image. It is to be noted that a three-dimensional tomogram of the measurement object body 812 can be obtained by scanning the mirror 810 within a plane perpendicular to a direction in which the projection light enters. Also, the information acquisition unit 804 may control the light source device 801 via an electric circuit 818. Although not illustrated, the information acquisition unit 804 may monitor the intensity of the light emitted from the light source device 801 successively, and may use the monitored data for amplitude correction of an intensity signal of the interfering light.

The OCT apparatus is useful for acquiring a tomogram inside a living body such as animals and humans in fields such as ophthalmology, dentistry, and dermatology. The information regarding a tomogram of a living body includes not only the tomogram of the living body but also numerical data necessary for obtaining the tomogram. In particular, the OCT apparatus is suitably used to acquire information regarding a tomogram of a measurement object including eye fundus, tooth, and blood vessel of a human body.

The present invention can provide the optical amplifying element that reduces ASE.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-222513, filed Nov. 12, 2015, which is hereby incorporated by reference herein in its entirety.

What is claimed is:

1. A light source device comprising:
a wavelength tunable laser; and
an optical amplifying element;
the optical amplifying element comprising:
a pair of reflectors that constitutes a cavity;
an active layer disposed between the pair of reflectors; and
an excitation unit configured to excite the active layer, wherein the active layer excited by the excitation unit amplifies the intensity of a laser beam that enters the optical amplifying element, and
an optical element configured to cause the laser beam emitted from the wavelength tunable laser to enter the optical amplifying element,
wherein the pair of reflectors is configured to change a length of the cavity according to a wavelength of the laser beam, and
wherein a light-emitting region of the optical amplifying element is larger than a light-emitting region of the wavelength tunable laser.

2. The light source device according to claim 1, wherein the cavity length of the cavity decreases as the wavelength of the laser beam decreases.

3. The light source device according to claim 1, wherein the cavity length of the cavity changes so that the wavelength of the laser beam is included in a full width at half maximum of a dip in a reflectivity spectrum of the optical amplifying element.

4. The light source device according to claim 1, wherein reflectivity of each reflector among the pair of reflectors of the optical amplifying element is 99.0% or less.

5. The light source device according to claim 1, further comprising:
a gap between at least one reflector of the pair of reflectors and the active layer; and
an electrode configured to move the at least one reflector.

6. The light source device according to claim 1, wherein the excitation unit comprises an electrode for injecting an electric current into the active layer.

7. The light source device according to claim 1, wherein the pair of reflectors and the active layer are laminated on a substrate in a direction perpendicular to the substrate.

8. The light source device according to claim 7, wherein the optical amplifying element emits light in the direction in which the pair of reflectors and the active layer are laminated.

9. The light source device according to claim 7, wherein the laser beam enters the optical amplifying element from a direction in which the pair of reflectors and the active layer are laminated.

10. The light source device according to claim 1, further comprising a gap between at least one reflector of the pair of reflectors and the active layer,
wherein the optical amplifying element comprises a control unit configured to move the at least one reflector, and
the control unit moves the at least one reflector so that the wavelength of the light emitted from the wavelength tunable laser is included in a full width at half maximum of a dip in a reflectivity spectrum of the optical amplifying element.

11. The light source device according to claim 1, wherein the wavelength tunable laser comprises a pair of reflectors and an active layer disposed between the pair of reflectors, one of the pair of reflectors of the wavelength tunable laser and one of the pair of reflectors of the optical amplifying element are common, and the active layer of the wavelength tunable laser and the active layer of the optical amplifying element are common.

12. The light source device according to claim 1, wherein the optical element is a lens formed on a surface of the optical amplifying element that receives the light emitted from the wavelength tunable laser.

13. The light source device according to claim 1, wherein the optical element comprises a circulator including a first port, a second port, and a third port, the wavelength tunable laser is optically connected to the first port, the optical amplifying element is optically connected to the second port, and the light emitted from the wavelength tunable laser is emitted from the circulator through the first port, the second port, the optical amplifying element, the second port, and the third port in this order.

14. An image pickup device comprising:

the light source device according to claim 1;

an interference optical system configured to branch the light from the light source device into projection light to project on a measurement object and reference light, and to generate interfering light from reflected light of the light projected on the measurement object and the reference light; and a detection unit configured to receive the interfering light.

15. An optical amplifying element comprising:

a pair of reflectors that constitutes a cavity;

an active layer disposed between the pair of reflectors; and an excitation unit configured to excite the active layer, wherein the active layer excited by the excitation unit amplifies the intensity of a laser beam that enters the optical amplifying element, wherein the pair of reflectors is configured to change a length of the cavity according to a wavelength of the laser beam, and wherein the pair of reflectors and the active layer are laminated on a substrate in a direction perpendicular to the substrate.

16. The optical amplifying element according to claim 15, wherein the optical amplifying element emits light in the direction in which the pair of reflectors and the active layer are laminated.

17. The optical amplifying element according to claim 15, wherein the laser beam enters the optical amplifying element from a direction in which the pair of reflectors and the active layer are laminated.

18. A light source device comprising:

an optical amplifying element, the optical amplifying element comprising:

a pair of first reflectors that constitutes a first cavity;

a first active layer disposed between the pair of first reflectors;

a first current confinement layer that includes a first low resistance region and is disposed between either one of the pair of first reflectors and the first active layer, and an excitation unit configured to excite the first active layer, wherein the first active layer excited by the excitation unit amplifies the intensity of a laser beam that enters the optical amplifying element, wherein the pair of first reflectors is configured to change a length of the first cavity according to a wavelength of the laser beam, a wavelength tunable laser, the wavelength tunable laser comprising:

a pair of second reflectors that constitutes a second cavity;

an second active layer disposed between the pair of second reflectors; and a second current confinement layer that includes a second low resistance region and is disposed between either one of the pair of second reflectors and the second active layer, and an optical element configured to cause the laser beam emitted from the wavelength tunable laser to enter the optical amplifying element, wherein the first low resistance region in an in-plane direction perpendicular to a light-emitting direction of the optical amplifying element is larger than the second low resistance region in an in-plane direction perpendicular to a light-emitting direction of the wavelength tunable laser.

* * * * *